(12) United States Patent
Cho et al.

(10) Patent No.: US 6,335,233 B1
(45) Date of Patent: Jan. 1, 2002

(54) METHOD FOR FABRICATING MOS TRANSISTOR

(75) Inventors: Chang-Hyun Cho; Gwan-Hyeob Koh; Mi-Hyang Lee; Dae-Won Ha, all of Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/347,822

(22) Filed: Jul. 2, 1999

(30) Foreign Application Priority Data

Jul. 2, 1998 (KR) .................................. 98-26582

(51) Int. Cl.[7] ..................... H01L 21/8238; H01L 21/336
(52) U.S. Cl. ........................ 438/199; 438/289; 438/362
(58) Field of Search ................................. 438/149, 199, 438/286, 302, 585, 766

(56) References Cited

U.S. PATENT DOCUMENTS

| | | | | |
|---|---|---|---|---|
| 4,700,454 A | * | 10/1987 | Baerg et al. ............... | 437/24 |
| 4,749,660 A | * | 6/1988 | Short et al. ................ | 437/24 |
| 5,288,650 A | * | 2/1994 | Sandow .................... | 437/24 |
| 5,468,657 A | * | 11/1995 | Hsu .......................... | 437/24 |
| 5,554,546 A | * | 9/1996 | Malhi ....................... | 437/40 |
| 5,658,809 A | * | 8/1997 | Nakashima et al. ......... | 438/766 |
| 5,795,800 A | * | 8/1998 | Chan et al. ................ | 438/149 |
| 5,872,049 A | * | 2/1999 | Gardner et al. ............ | 438/585 |
| 5,877,048 A | * | 3/1999 | Wu ........................... | 438/199 |
| 5,930,642 A | * | 7/1999 | Moore et al. ............... | 438/407 |
| 5,970,347 A | * | 10/1999 | Gardner et al. ............ | 438/286 |
| 6,011,290 A | * | 1/2000 | Gardner et al. ............ | 257/345 |
| 6,030,875 A | * | 2/2000 | May et al. ................. | 438/302 |

* cited by examiner

Primary Examiner—John F. Niebling
Assistant Examiner—Walter L. Lindsay, Jr.
(74) Attorney, Agent, or Firm—The Law Offices of Eugene M. Lee, PLLC

(57) ABSTRACT

A first conductive impurity ion is implanted into a semiconductor substrate to form a well area on which a gate electrode is formed. A first non-conductive impurity is implanted into the well area on both sides of the gate electrode to control a substrate defect therein and to form a first precipitate area to a first depth. A second conductive impurity ion is implanted into the well area on both sides of the gate electrode, so that a source/drain area is formed to a second depth being relatively shallower than the first depth. A second non-conductive impurity is implanted into the source/drain area so as to control a substrate defect therein and to form a second precipitate area. As a result, substrate defects such as dislocation, extended defect, and stacking fault are isolated from a P-N junction area, thereby forming a stable P-N junction.

10 Claims, 4 Drawing Sheets

METHOD FOR FABRICATING MOS TRANSISTOR

BACKGROUND OF THE INVENTION

1. Field of the Invention

The present invention relates to a method for fabricating a semiconductor device and, more particularly, to a method for fabricating a MOS transistor capable of reducing P-N junction leakage current generated by substrate defects.

2. Background of the Invention

As the integration level of semiconductor memory devices increases, the integration level is progressing to a DRAM (dynamic random access memory) device having a size of a gigabit or more. Since components of a gigabit unit device are scaled down to less than 0.18 µm, the likelihood that stress may occur increases greatly.

If the stress surpasses a critical value, dislocation may be generated in the device's silicon substrate to relieve the stress. Due to the scaling down, the process of forming a device isolation area converts a LOCOS (local oxidation of silicon) into an STI (shallow trench isolation). However, the STI may apply more stress to the semiconductor substrate than the LOCOS. As mentioned in an article entitled "Stress-induced Dislocation in Silicon Integrated Circuits" (P. M. Fahey et al., IBM J. RES. DEVELOP, v. 36, p. 158, 1992), it is increasingly reported to improve junction damage generated by dislocation and extended defect.

In the fabricating process of a semiconductor, the ion implanting technique is important in the method for fabricating a P-N junction of a device due to the easy implementation of a doping concentration and a doping profile. However, ions having high energy can penetrate a single crystalline silicon during this ion implanting process. If the doping concentration surpasses a critical value, then the crystallinity of the silicon substrate is broken to form an amorphous layer. The crystallinity of the amorphous layer is restored through a subsequent annealing step. During the annealing, remaining defects are collected to generate an extended defect, a stacking fault, and a dislocation loop (as discussed, for example, in "Formation of Extended Deffects in Silicon by High Energy Implantation of B and P", J. Y. Cheng et. al., Phys. v. 80 (4) p. 2105, 1996; "Annealing Behaviours of Dislocation Loops Near the Projected Range in High-dose As-Implanted (001) Si", S. N. Hsu et. al., J Appi. Phys. v. 86 (9). p. 4503, 1990).

FIG. 1A is an XTEM (X-transmission electron microscopy) photograph illustrating a defect in a prior semiconductor substrate. Referring to FIG. 1A, if the dislocation, extended defect, and stacking fault penetrate a P-N junction area 'A' of a semiconductor device, then abnormal junction characteristics are generated.

FIG. 1B is an SEM (scanning electron microscopy) photograph illustrating a defect in a prior semiconductor substrate. Referring to FIG. 1B, defects are generated in an edge portion 'B' adjacent to a device isolation area and an active area due to the ion implanting process. If a reverse bias voltage is applied to the P-N junction, the reverse bias current to the P-N junction is abnormally applied due to the defects.

FIG. 2 is a graph illustrating electrical characteristics of a P-N junction in a prior semiconductor device. Referring to FIG. 2, in the case that a reverse bias voltage is applied to the P-N junction of the prior semiconductor device, a 'C' curve depicts reverse bias current at an abnormal junction, and a 'D' curve depicts reverse bias current at a normal junction. It is shown that the reverse bias current at the abnormal junction is greater than the reverse bias current at the normal junction. These characteristics may increase standby current, which may create a severe problem in fabricating a low power consumption device, result in failing components, and reduce yield.

SUMMARY OF THE INVENTION

A method consistent with the present invention provides for a semiconductor device capable of forming a stable P-N junction by isolating lattice defects, such as a dislocation, an extended defect, and a stacking fault, from a P-N junction area.

According to the present invention, a gate electrode is formed on a semiconductor substrate. A conductive impurity is implanted into the semiconductor substrate on both sides of the gate electrode to form a source/drain area. A non-conductive impurity is implanted into the source/drain area to form a precipitate area.

According to another aspect of the present invention, a first conductive impurity is implanted into a semiconductor substrate to form a well area. A gate electrode is formed on the well area. A first non-conductive impurity is implanted into the well area on both sides of the gate electrode to form a first precipitate area to a first depth. A second conductive impurity is implanted into the well area on both sides of the gate electrode to form a source/drain area to a second depth which can be relatively shallower than the first depth. A second non-conductive impurity is implanted into the source/drain area to form a second precipitate area.

A transistor consistent with the present invention comprises a first conductive well area formed in a semiconductor substrate, a first precipitate area formed to a first depth by implanting a first non-conductive impurity into the first conductive well, a gate electrode formed on the first conductive well, a second conductive source/drain area formed in the first well area on both sides of the gate electrode to a second depth which can be relatively shallower than the first depth, and a second precipitate area formed by implanting a second non-conductive impurity into the source/drain area.

In the method consistent with the present invention, a first non-conductive impurity is implanted into the well area to form a first precipitate area which can control substrate defects. A second non-conductive impurity is implanted into the source/drain area to form a second precipitate area which can also control substrate defects. As a result, substrate defects such as dislocation, extended defect, and stacking fault are isolated from a P-N junction area, thereby forming a stable P-N junction.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

The preferred embodiment of the present invention is described in greater detail with reference to accompanying drawings. In addition, Korean application no. 98-26582, filed Jul. 2, 1998, is hereby incorporated by reference as if fully set forth herein.

FIGS. 3A through 3D sequentially illustrate the process steps of fabricating a MOS transistor according to the present invention.

Figure 1A:
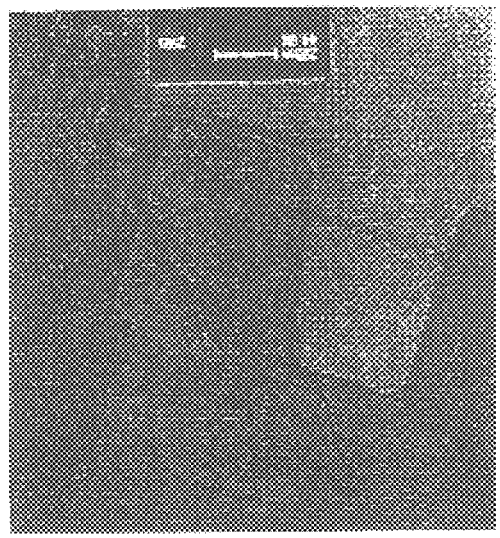
FIG. 1A is an XTEM (X-transmission electron microscopy) photograph illustrating a defect in a prior semiconductor substrate.
Figure 1B:
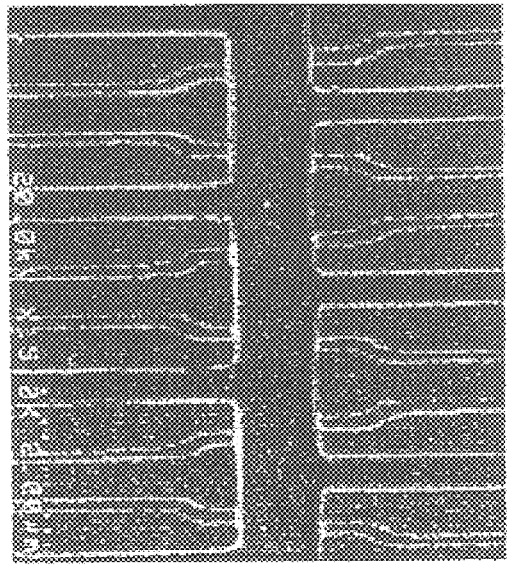
FIG. 1B is an SEM (scanning electron microscopy) photograph illustrating a defect in a prior semiconductor substrate.
Figure 2:
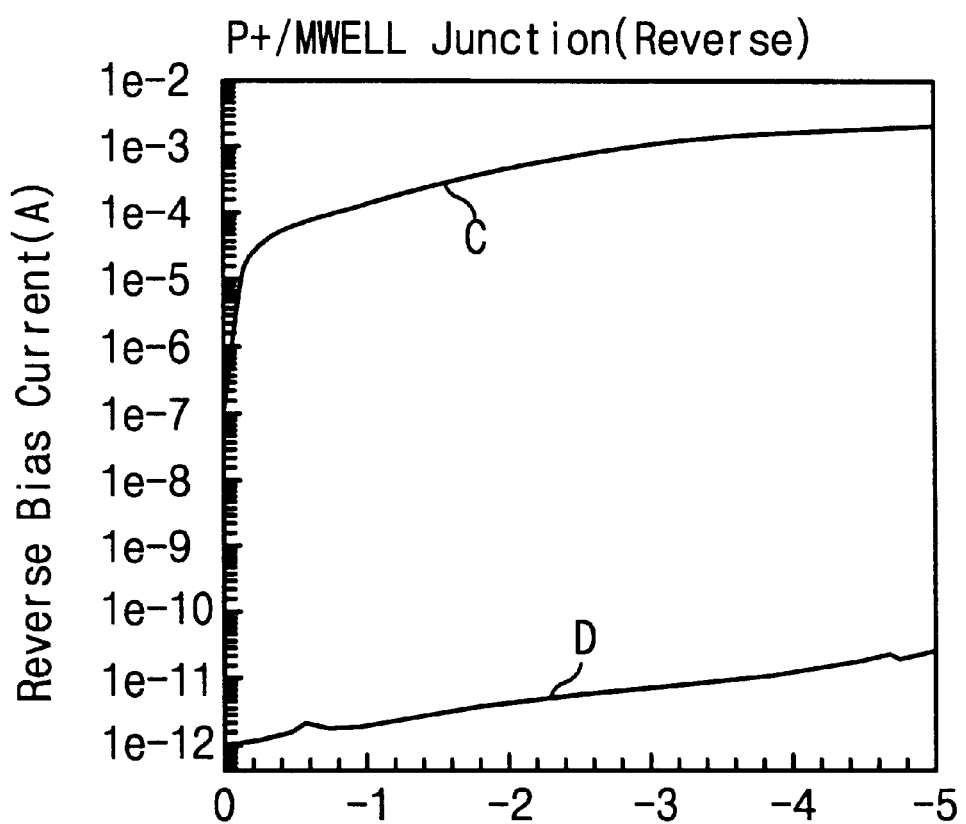
FIG. 2 is a graph illustrating electrical characteristics of a P-N junction in a prior semiconductor device.
Figure 3A:
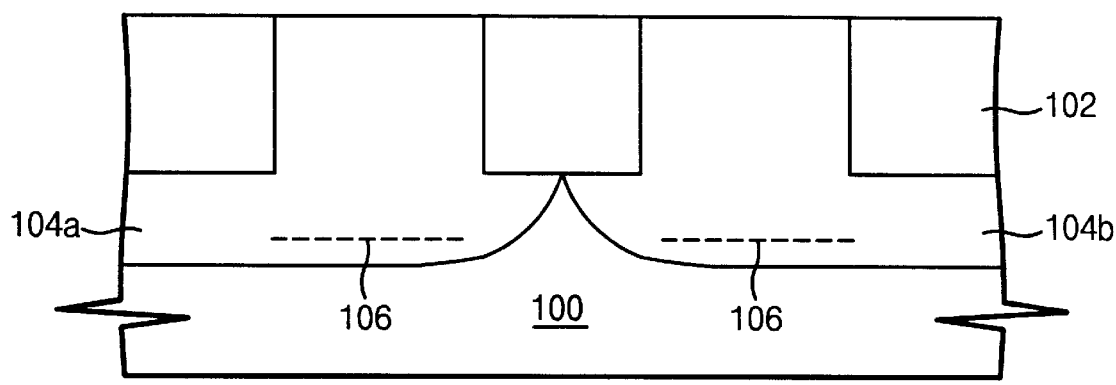
FIGS. 3A through 3D are flow diagrams illustrating the process steps of fabricating a MOS transistor consistent with the present invention.

Referring to FIG. 3A, a device isolation area 102 is formed on a semiconductor substrate 100 to define active and inactive areas. The device isolation area 102 may be formed of, for example, STI (shallow trench isolation). The active areas are divided into PMOS and NMOS areas. Conventionally, an N-type impurity ion is implanted into the PMOS area so that an N-type well area 104a is formed, and a P-type impurity ion is implanted into the NMOS area so that a P-type well area 104b is formed. A first nonconductive impurity is implanted into an overall surface of the semiconductor substrate 100, so that a first precipitate area 106 is formed on the N-type and the P-type well areas 104a and 104b, respectively. Since the first non-conductive impurity can be formed from a material selected from a group consisting of oxygen, carbon, and nitrogen, the first precipitate area can be formed from a material selected from a group consisting of $SiO_2$, SiC, and SiN.

The first non-conductive impurity should be formed on a stable area having no electrical polarity by implanting impurity such as oxygen and comprising a chemical compound with the semiconductor substrate 100, and a precipitate area comprising only itself. Further, an implanting concentration of the first non-conductive impurity should be more than the solid solubility ($10^{18}$ atoms/cm$^3$) of the semiconductor substrate 100 (i.e., silicon substrate), and less than a concentration at which the first precipitate area 106 may form an undesirable layer. If the concentration of oxygen implanted into the first non-conductive impurity is too high, a new $SiO_2$ layer making, a SIMOX (separation by implanted oxygen) structure is formed. It is undesirable to form a new layer such as an $SiO_2$ layer. Accordingly, the concentration of oxygen that is implanted should be so low enough to ensure that the semiconductor substrate 100 is not formed with this structure. A method of controlling implanting concentration is well described in U.S. Pat. No. 4,749,660, which is incorporated herein by reference.

Figure 3B:
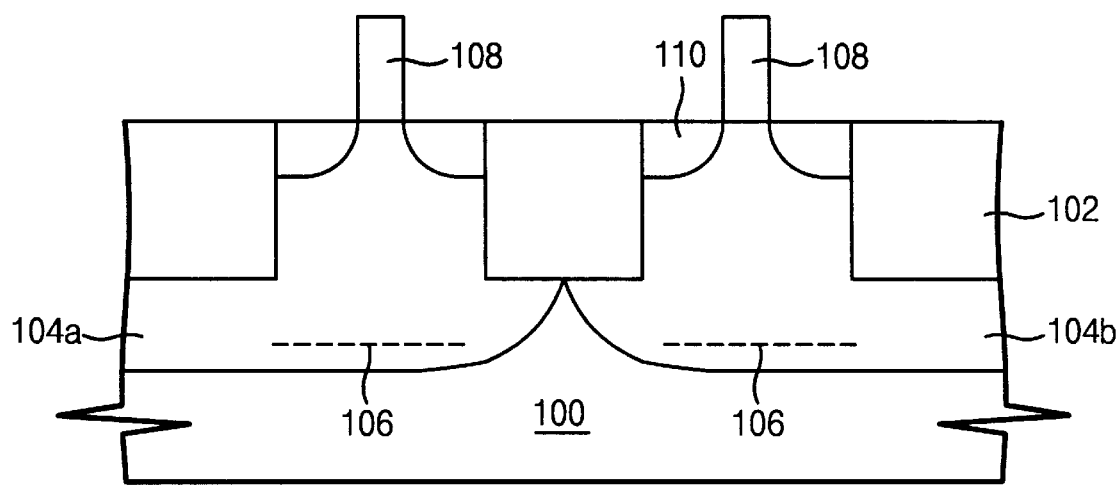

Referring to FIG. 3B, a gate electrode 108 is formed on the semiconductor substrate 100 with a gate oxide layer interposed therebetween. A low concentration of a conductive impurity ion for forming an LDD (low doped drain) is implanted into the semiconductor substrate 100 of the active area using the gate electrode 108 as a mask, so that a low concentrated source/drain area 110 is formed. A P-type impurity ion is implanted into the N-type well area, and an N-type impurity ion is implanted into the P-type well area.

Figure 3C:
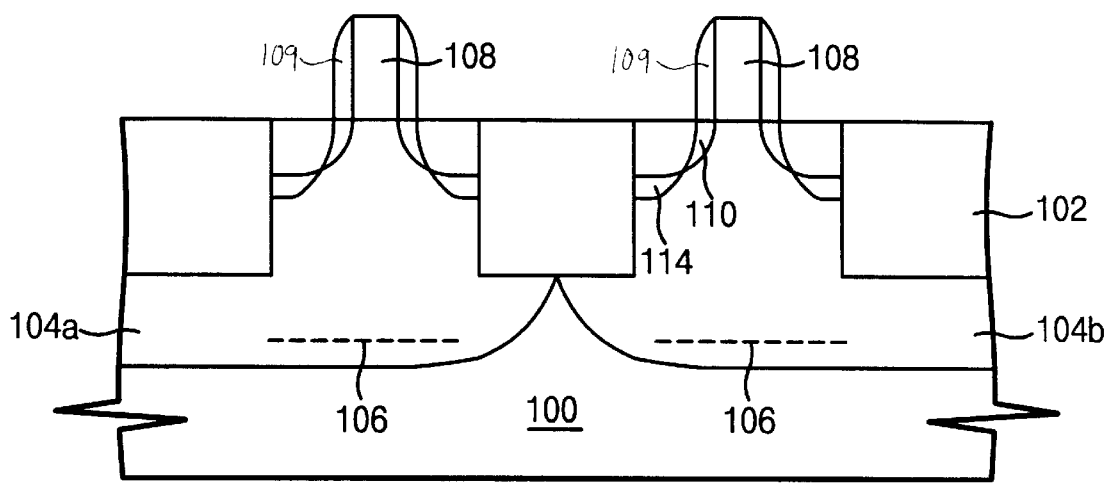

Next, referring to FIG. 3C, a spacer 109 is formed on both sidewalls of the gate electrode 108. For example, after formation of a silicon nitride layer on the semiconductor substrate 100 including the gate electrode 108, the silicon nitride layer is anisotropically etched to form a spacer 109.

A high concentration of a conductive impurity ion for reducing sheet resistance and contact resistance is implanted using the spacer 109 and the gate electrode 108 as a mask, so that a high concentrated source/drain area 114 is formed. A P-type impurity ion is implanted into an N-type well area, and an N-type impurity ion is implanted into a P-type well area. Then, the high and low concentrated source/drain areas 114 and 110, respectively, are formed in the semiconductor substrate 100 with an equal depth, or the high concentrated source/drain area 114 is formed to be relatively deeper than the low concentrated source/drain area 110. The high concentrated source/drain area 114 is preferably formed to be shallower than the first precipitate area 106.

Figure 3D:
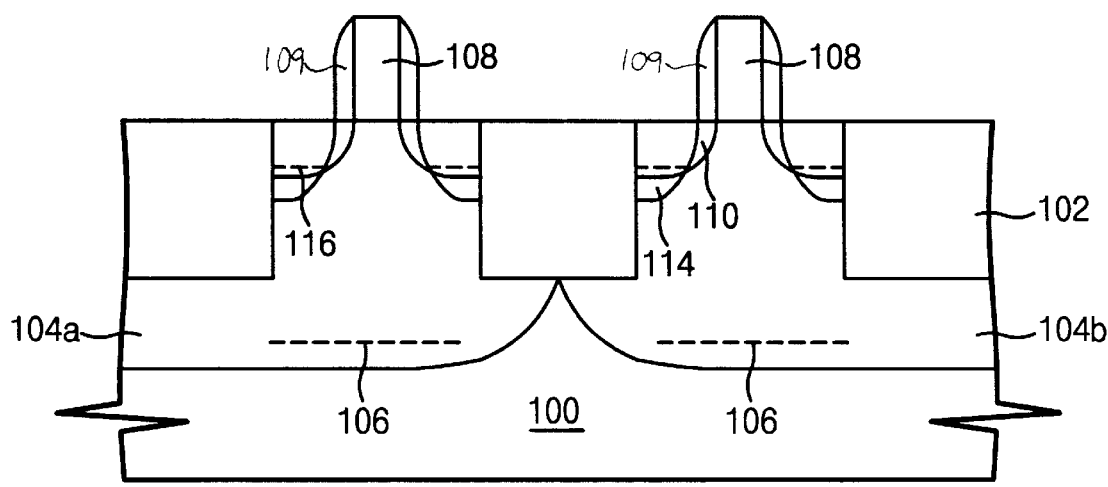

Next, referring to FIG. 3D, a second non-conductive impurity is implanted by using the gate electrode 108 and the spacer 109 as a mask, so that a second precipitate area 116 is formed. The second non-conductive impurity can be formed from a material selected from a group consisting of oxygen, carbon, and nitrogen. Like the first non-conductive impurity, the implanted concentration of the second non-conductive impurity should be more than the solid solubility ($10^{18}$ atoms/cm$^3$) of the semiconductor substrate 100 (i.e., silicon substrate), and less than a concentration at which the second precipitate area 116 may form an undesirable layer. The depth of the second precipitate area 116 is preferably shallower than that of the high concentrated source/drain area 114.

The first and second precipitate areas 106 and 116, respectively, which are formed by implanting the non-conductive impurity, may serve the following functions:

A small overlaying defect and a dislocation loop are generated by a lattice defect due to the ion implantation, a lattice defect due to the STI stress, and an amorphous layer. Afterwards, these grow into substrate defects, such as an extended defect and a dislocation. The ion implanting defect is well described, for example, in "Ion Implantation Science and Technology" J. F. Ziegler, pp. 63–92, Academic Press 1988.

Formula 1

$$\in = (a'-a)/a$$

In Formula 1, $\in$ is a strain of a semiconductor substrate, a is a radius of a spherical ace in a semiconductor substrate, and a' is the size of a precipitate. Formula 1 illustrates a strain generated by letting an elastic body of radius a into a spherical space in a emiconductor substrate of radius'.

Formula 2

$$Ui = 4 \times G \times b \times a^3 \times \in \times \sin\theta / r$$

In Formula 2, Ui is an energy operating between an electric potential of a substrate defect and a precipitate of radius a', G is an elastic coefficient of a semiconductor substrate (i.e., a silicon substrate), b is a degree of the dislocation, a is a radius, which is almost similar to the radius of a precipitate of a spherical space, r is a distance between the precipitate and the electric potential, and $\in$ is the strain in Formula 1. Formula 2 is described in "Impurities and Imperfections" E. R. Parker, J. Washburn, ASM, Metals Park, Ohio, p. 155, 1955.

Referring to FIG. 3D, a MOS transistor of this invention comprises well areas 104a and 104b formed in the semiconductor substrate 100, a first precipitate area 106 formed in the well areas 104a and 104b, a gate electrode 108 formed in the well areas 104a and 104b, source/drain areas 110 and 114 formed in well areas 104a and 104b on both sides of the gate electrode, wherein the source/drain areas 110 and 114 can be shallower than the first precipitate area 106 in depth, and a second precipitate area 116 is formed in the source/drain area 110 and 114.

If a precipitate area, as in Formula 2, is in a single crystalline form of silicon, a force, reacting to the precipitate, may generate a dislocation. Then, the force enables the dislocation, as the substrate defect, to be pulled out of the precipitate or not to be grown further. In case the precipitate is formed at a bit of distance from the P-N junction, the substrate defects may go away from an interface of the P-N junction. As a result, it is impossible for the substrate defects to penetrate the interface thereof, and the interface damage generated by the substrate defects is prevented.

Since a P-N junction area may be damaged by substrate defects such as dislocation in a prior semiconductor device, the P-N junction area results in abnormal reverse bias current characteristics. A precipitate area, however, formed adjacent to the P-N junction area in the present invention prevents growth of the substrate defects and damage to the P-N junction area.

What is claimed is:

1. A method for fabricating a MOS transistor, comprising:

forming a gate electrode on a semiconductor substrate;

implanting a conductive impurity into the semiconductor substrate on both sides of the gate electrode to form a source/drain area; and implanting a non-conductive impurity into the source/drain area to form a precipitate area, wherein the implanting concentration of the non-conductive impurity is in the range between $1 \times 10^{18}$ atom/cm$^3$ and $1 \times 10^{20}$ atoms/cm$^3$, a value sufficient to suppress formation of a SiO$_2$ layer in SIMOX (separation by implanted oxygen).

2. The method according to claim 1, wherein the non-conductive impurity is a material selected from the group consisting of oxygen, carbon, and nitrogen.

3. The method according to claim 1, wherein the precipitate area prevents the formation of semiconductor substrate defects.

4. A method for fabricating a MOS transistor, comprising:

implanting a first conductive impurity ion into a semiconductor substrate to form a well area;

implanting a first non-conductive impurity into the well area to form a first precipitate area to a first depth in the well area;

forming a gate electrode on the well area;

implanting a second conductive impurity into the well area on both sides of the gate electrode to form a source/drain area to a second depth, the second depth being relatively shallower than the first depth; and implanting a second non-conductive impurity into the source/drain area to form a second precipitate area to a third depth, the third depth being relatively shallower than the second depth.

5. The method according to claim 4, wherein the non-conductive impurity is a material selected from the group consisting of oxygen, carbon, and nitrogen.

6. The method according to claim 4, wherein the second non-conductive impurity is a material selected from the group consisting of oxygen, carbon, and nitrogen.

7. The method according to claim 4, wherein an implanting concentration of the first non-conductive impurity is in the range between $1 \times 10^8$ atom/cm$^3$ and $1 \times 10^{20}$ atoms/cm$^3$, a value sufficient to suppress formation of a SiO$_2$ layer in SIMOX (separation by implanted oxygen).

8. The method according to claim 4, wherein an implanting concentration of the second non-conductive impurity is in the range between $1 \times 10^{18}$ atom/cm$^3$ and $1 \times 10^{20}$ atoms/cm$^3$, a value sufficient to suppress formation of a SiO$_2$ layer in SIMOX (separation by implanted oxygen).

9. The method according to claim 4, wherein the first precipitate area prevents the formation of semiconductor substrate defects.

10. The method according to claim 4, wherein the second precipitate area prevents the formation of semiconductor substrate defects.

* * * * *